United States Patent [19]

Ohta

[11] Patent Number: 4,497,013
[45] Date of Patent: Jan. 29, 1985

[54] ILLUMINATING APPARATUS

[75] Inventor: Masakatu Ohta, Tokyo, Japan

[73] Assignee: Canon Kabushiki Kaisha, Tokyo, Japan

[21] Appl. No.: 508,333

[22] Filed: Jun. 27, 1983

[30] Foreign Application Priority Data

Jul. 2, 1982 [JP] Japan .............................. 57-115846

[51] Int. Cl.³ .............................................. F21V 7/04
[52] U.S. Cl. ..................................... 362/32; 362/268; 362/293; 362/308; 362/331; 362/346
[58] Field of Search ................. 362/32, 268, 293, 308, 362/331, 346

[56] References Cited

U.S. PATENT DOCUMENTS 4,206,494  6/1980  Lovering .............................. 362/32

Primary Examiner—Stephen J. Lechert, Jr.
Attorney, Agent, or Firm—Fitzpatrick, Cella, Harper & Scinto

[57] ABSTRACT

An illuminating apparatus is provided with an illuminating unit for forming a plurality of secondary light sources, the illuminating unit having a light source, a light converging device for converging photoenergy emitted from the light source, and a first multi-beam forming optical element for forming multiple light beams. A second multi-beam forming optical element produces a uniform luminance distribution and forms multiple light beams. A first converging optical system converges the photoenergy emitted from the first multi-beam forming optical element on the second multi-beam forming optical element, and a second converging optical system converges the photoenergy emitted from the second multi-beam forming optical element on a photomask.

15 Claims, 6 Drawing Figures

ILLUMINATING APPARATUS

BACKGROUND OF THE INVENTION

1. Field of the Invention

This invention relates to an illuminating apparatus, and more particularly to an illuminating apparatus for illuminating a mask or reticle carrying a circuit pattern thereon by visible or invisible photoenergy in a semiconductor printing apparatus.

2. Description of the Prior Art

In the semiconductor manufacturing process, and particularly, in the printing (transfer) step thereof, an integrated circuit pattern is transferred from a mask onto a wafer. The transfer is achieved by one of several methods, including one whereby the mask and wafer are brought into contact with each other for printing, one whereby printing is effected with the mask supported at a very minute distance from the wafer, and one whereby the pattern on the mask (what is generally called a reticle is also referred to as a mask) is projected onto the wafer through an imaging optical system and printed on the wafer.

In the latter case, it greatly affects the performance of the pattern image to illuminate the mask well and for this reason, many technical improvements in this respect have been made. Various systems are known the objects which are to eliminate irregularity of illuminance on the surface of the mask, improve the converging efficiency and set the maximum value of the angle of incidence of the light beam incident on the surface of the mask (hereinafter referred to as the converging angle) to a desired value. Of these systems, the one which has been the most popular in recent years is of the type in which a plurality of secondary light sources arranged on a plane are formed from an original light source by the use of a prism or a multilens and the multiple light beams from the secondary light sources are applied to the surface of the mask by means of a converging collimator lens. Such system is disclosed, for example, in Japanese Laid-Open patent application Nos. 103976/1975 or 129045/1975. In such system, the elimination of irregularity of illuminance has been remarkably improved because the light beams from the secondary light sources scattered about the optical axis are all superposed on the wafer. On the other hand, the use of an elliptical mirror as means for converging the light beam emitted from the light source on a multibeam forming optical element for forming secondary light sources leads to enhanced converging efficiency and therefore, it has already been used in semiconductor printing apparatus.

However, the conventional system using secondary light sources does not provide uniform luminance distribution of the secondary light sources although it has been found to be effective in the elimination of irregularity of illuminance. Therefore, with such system, it is difficult to set the effective converging angle to a desired value. That is, assuming that the secondary light sources are seen from any point on the wafer, the secondary light source near the optical axis has a greater quantity of light than other secondary light sources and thus, the luminance differs depending on the direction in which the secondary light sources are seen. Accordingly, where the difference in quantity of light between the secondary light source near the optical axis and the secondary light sources in the marginal portion is great, the substantial converging angle depends on the secondary light source near the optical axis. Even if the secondary light sources in the marginal portion are shielded from light by a stop, it is difficult to control the converging angle and as a result, improved resolution could not be expected.

For example, in the case of a system in which printing is effected with a wafer and a mask being held in close proximity to each other, diffraction is caused by the edge of the pattern of the mask. As a result, during the exposure time, the surface of the mask is irradiated from different directions in order to suppress the influence of the side-lob (sub-peak) created in the light intensity curve of the projected image. However, it has been pointed out that in this case, the resolution greatly varies depending on the value of the converging angle, and an optimum converging angle is said to be about 3° for the half-angle (the article "Lenses for IC and Printing Apparatus" in the 13th Summer Seminar papers on "Optics and IC Technique"). If, as described above, it is difficult to set the converging angle to a desired value and shape, the resolution cannot be improved.

In the case of the projection printing system, the image of a secondary light source (hereinafter referred to as the effective light source) is formed on the entrance pupil of a projection lens and it is well known that the size, shape and intensity distribution of this effective light source greatly affect the imaging performance of the projection lens. Accordingly, this system also is non-uniform in luminance distribution of the secondary light source. If it is difficult to set the effective light source to a desired size, shape and intensity distribution, the improvement of the performance will be hampered.

As described above, the luminance distribution of the secondary light source is a factor which has a reat effect in determining the resolution. Even in the conventional illuminating system, a method is conceivable in which a stop for making uniform the luminance distribution of the secondary light source is disposed adjacent to the secondary light source and only a part of the secondary light source whose luminance distribution can be regarded as uniform is used. However in such method, the loss of the quantity of light is great. Therefore in reality, such method is a compromise between resolution and converging efficiency and thus, cannot be said to be an effective method.

SUMMARY OF THE INVENTION

It is an object of the present invention to illuminate well an object to be irradiated.

It is another object of the present invention to realize illumination of uniform luminance distribution.

It is still another object of the present invention to obtain high converging efficiency.

It is yet still another object of the present invention to enable a secondary light source to be set to a desired shape.

It is a further object of the present invention to provide an illuminating apparatus suitable for illuminating a photomask or reticle provided with a minute electronic circuit pattern.

To achieve these objects, the present invention adopts a construction in which a plurality of secondary light sources are formed and used to illuminate a multibeam forming optical element and the emergent light from the optical element illuminates an object such as a mask. The multi-beam forming optical element includes an array comprising pairs of positive lenses disposed at the focus positions thereof and arranged two-dimensionally, a fly's-eye lens comprising a number of positive or negative lenses as elements, lenticular sheets superposed one upon another with the bus of each being orthogonal to one another, a bar lens group, an optical fiber bundle, a fiber plate comprising a sintered self-focusing optical fiber bundle having a refractive index varying from the center toward the margin thereof, and a diffusing plate or a diffusing element of strong orientation. The optical element is means for forming continuously or non-continuously enlarged secondary light sources.

The invention will become more fully apparent from the following detailed description thereof taken in conjunction with the accompanying drawings.

DESCRIPTION OF THE PREFERRED EMBODIMENTS

Figure 1:
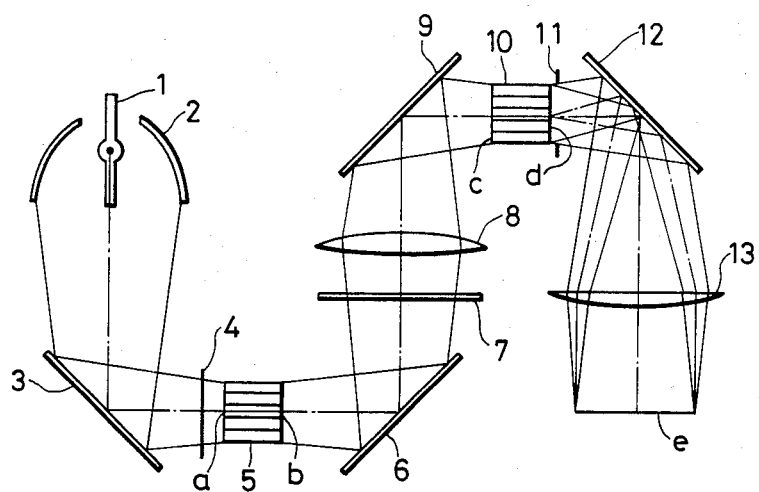
FIG. 1 is an optical cross-sectional view showing a first specific embodiment of the present invention.

Referring to FIG. 1 which depicts a first embodiment of the present invention, reference numeral 1 designates a light source which may be, for example, a super-high-pressure mercury-vapor lamp because it is desired that the light source be of high luminance. Denoted by 2 is an elliptical mirror having the function of wastelessly converging the light beam emitted from the light source 1. The elliptical mirror 2 is disposed so that the light source 1 is positioned at the first focus thereof, and converges the light beam emitted from the light source at the second focus position thereof. Reference numeral 3 designates a cold mirror for transmitting most of infra-red light therethrough and reflecting ultraviolet light. The cold mirror 3 has the functions of filtering light and bending the optical path. Reference numeral 4 denotes a shutter for limiting radiation energy. Designated by 5 is a multi-beam forming optical element which may comprise pairs of positive lenses $L_1$ and $L_2$ having the same focal length and disposed at the focus positions thereof and fixed to a barrel, the pairs of positive lenses being arranged two-dimensionally. A first row including the positive lenses $L_1$ is disposed so as to be coincident with the second focus of the elliptical mirror 2, and for the reason set forth below, a plurality of secondary light sources are formed on a second row including the positive lenses $L_2$.

Reference numerals 6 and 9 designate plane mirrors for bending the optical axis by 90° and making the entire illuminating system compact. Denoted by 7 is a sharp cut filter for cutting light of a wavelength shorter than the printing wavelength. Reference numeral 8 designates a converging collimator lens, and reference numeral 10 denotes a multi-beam forming optical element similar in structure to the multi-beam forming optical element 5. The secondary light source surface b of the multi-beam forming optical element 5 (the second row of the positive lens) lies at one focus position of the converging collimator lens 8, and the object surface c of the multi-beam forming optical element 10 (the first row of the positive lens) lies at the other focus position of the converging collimator lens 8. Designated by 11 is a stop having the function of setting the final secondary light source to a desired size and shape. Denoted by 12 is a plane mirror for bending the optical axis by 90°. Reference numeral 13 designates a second converging collimator lens. One focus position of the second converging collimator lens 13 is coincident with the secondary light source surface d of the multi-beam forming optical element 10, and the other focus position of the second converging collimator lens 13 is coincident with the object surface e. A mask is disposed on this object surface e, and a pattern is printed on a wafer which is in contact with or closely adjacent to the mask, or is printed on the wafer through a projection lens, not shown.

The collimator lens 8 or 13 usually comprise a plurality of single lenses, but here they are depicted as one lens for the sake of convenience.

Figure 3:
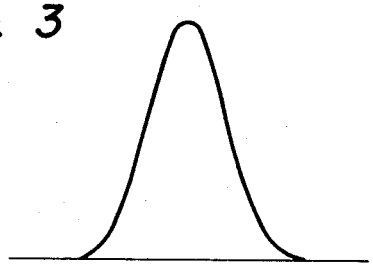
FIG. 3 shows the intensity distribution of the image of a light source.

In the above-described construction, when the light source 1 is turned on, the image of the light source is formed on the second focal plane a of the elliptical mirror 2 by the elliptical mirror. The intensity distribution of this light source image is very non-uniform as depicted in FIG. 3 due to the aberrations of the elliptical mirror 2, and is most intense on the optical axis and is sharply reduced as it becomes far away from the optical axis. Accordingly, in this stage, if an attempt is made to illuminate the first object surface c with the light source image as a secondary light source, the luminance distribution is non-uniform and the irregularity of the luminance of the light source 1 appears as the non-uniformity of the distribution characteristic. Therefore, the first object surface c cannot be uniformly illuminated by the critical illumination method or the Kohler illumination method.

Figure 4:
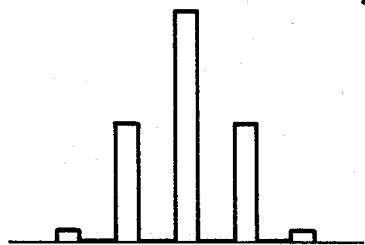
FIG. 4 shows the luminance distribution of a secondary light source b.
Figure 5:
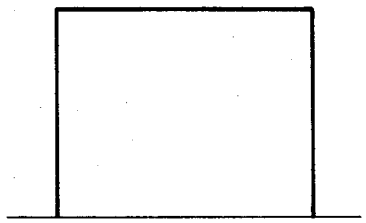
FIG. 5 shows the luminance distribution of a secondary light source d.

Since the multi-beam forming optical element 5 is disposed on the second focal plane a of the elliptical mirror 2, the light beam forming the image of the light source 1 on the second focal plane a is divided into a plurality of small sections (sections by the two-dimensionally arranged positive lenses), and parallel components of the light beam having various inclination are imaged by the positive lens of the first row and form a new secondary light source b corresponding to the angle of incidence in each of the small sections. This secondary light source has irregular luminance but is uniform in distribution characteristic (FIG. 4). It is the function of the multi-beam forming optical element to form a secondary light source of uniform distribution characteristic from a light source of non-uniform distribution characteristic, and if the first object surface c is illuminated by the use of such secondary light source and by the Kohler illumination method, uniform illuminance is obtained. Further, the first object surface c is regarded as the image of the light source and the multi-beam forming optical element 10 is disposed there, whereby the newly formed secondary light source d has no irregularity of luminance and is very uniform in distribution characteristic (FIG. 5). Therefore, if the second object surface e is illuminated by this new secondary light source d and by the use of the converging collimator lens 13, the irregularity of illuminance will be remarkably decreased.

On the other hand, the shutter 4 for limiting the radiation energy illuminating the second object surface e (mask) is disposed adjacent to the second focal plane a of the elliptical mirror 2, and the variation in luminance distribution when the shutter 4 is opened and closed is negated by the multi-beam forming optical element 10. Thus the distribution characteristic of the new secondary light source d can maintain a uniform condition free of irregularity of luminance. Further, the influence of the variation in luminance distribution of the secondary light source b accompanying the fluctuation of the arc image intensity distribution on the second focal plane a resulting from the sway of the arc of the original light source 1 during the exposure time or any mounting error of the arc is also negated for the reason set forth above.

Also, since the luminance distribution of the secondary light source d is uniform, the size and shape of the secondary light source d can be freely and easily changed by changing the size and shape of the stop 11 disposed adjacent to the secondary light source d.

Figure 6:
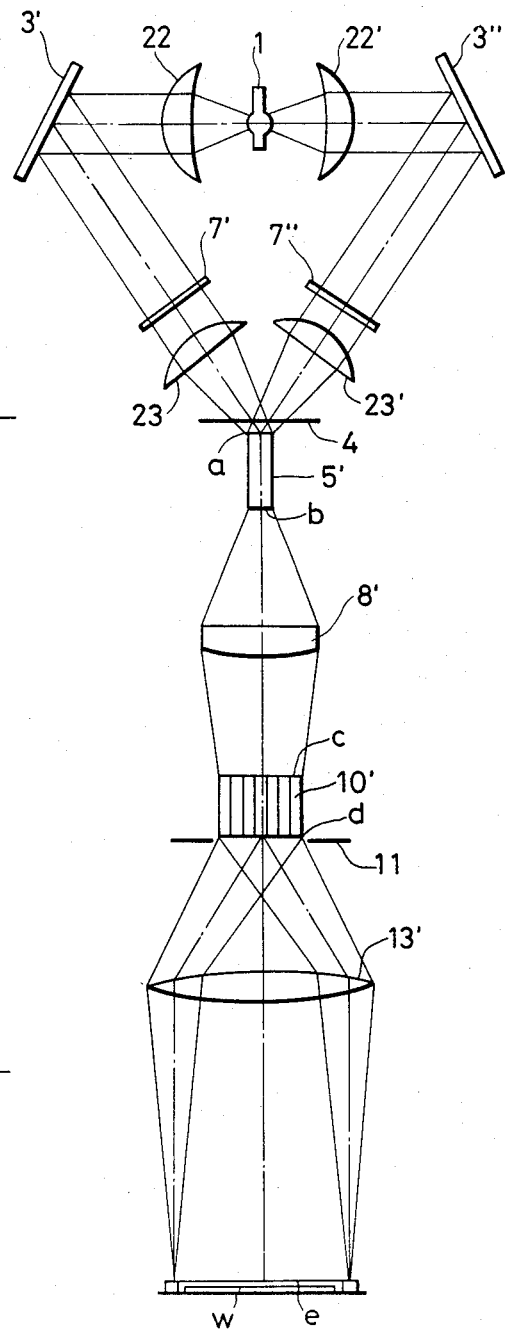
FIG. 6 is an optical cross-sectional view showing a second specific embodiment of the present invention.

FIG. 6 shows another embodiment. In FIG. 6, reference numeral 1 designates a light source similar to that in the above-described embodiment. Denoted by 22 and 22' are condenser lenses. In this Figure, left and right condenser lenses are utilized, but alternatively, two additional condenser lenses may be disposed in a direction perpendicular to the plane of the drawing sheet. The condenser lenses 22 and 22' have the function of wastelessly condensing the light beams emitted from the light source 1. Designated by 3' and 3" are cold mirrors for filtering infrared light from the light beams converted into parallel light beams by the condenser lenses 22 and 22' and for directing them to condenser lenses 23 and 23'. Reference numerals 7' and 7" denote filters for intercepting light of the other wavelength than the wavelength used. The filters 7' and 7" are mounted between the cold mirror 3', 3" and the condenser lenses 23, 23'. Denoted by 4 is a shutter.

Figure 2:
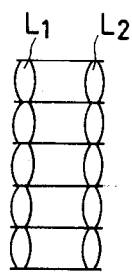
FIG. 2 is a cross-sectional view of the components of the first specific embodiment.

Reference numeral 5' designates a multi-beam forming optical element which is, for example, an optical fiber bundle bundled so that the row of the input surface and the output surface thereof is random. The input surface a of the multi-beam forming optical element is made coincident with the focus position of the condenser lenses 23 and 23'. Reference numeral 8' denotes a converging collimator lens, and reference numeral 10' designates a multi-beam forming optical element the structure of which is depicted, for example, in FIG. 2. The output surface b of the multi-beam forming optical element 5 lies on the first focus of the collimator lens 8 and the first object surface c of the multi-beam forming optical element 10' lies on the second focus of the collimator lens 8 and therefore, a secondary light source on the output surface b illuminates the first object surface c by Kohler illumination without irregularity. The arrangement subsequent to the collimator lens 8' is similar to that of FIG. 1. Reference numeral 13' designates a collimator lens, and e denotes a second object surface on which a mask is supported. Denoted by w is a wafer.

The end surface of the post-stage multi-beam forming optical element 10' is uniformly illuminated by the above-described construction and therefore, the secondary light source formed on the other end surface d is a light source having no irregularity of luminance and having uniform distribution characteristic. Thus it is an ideal light source for the second object surface e.

The arrangement of the optical system preceding the post-stage multi-beam forming optical element 10', shown in FIG. 6, is different from that shown in FIG. 1, but they are entirely identical in theoretical effect. That is, in FIG. 1, an elliptical mirror is used to efficiently converge the light beam emitted from the light source and form the image of the light source on the end surface a of the pre-stage multi-beam forming optical element, while in FIG. 6, two sets (or four sets) of condenser lens systems are used for the same purpose. Alternatively, the light beam reflected by the elliptical mirror may be converted into a parallel light beam by a lens and a fly's-eye lens or the like may be disposed in this parallel light beam. The post-stage multi-beam forming optical element is not limited to the structure of FIG. 2, but may be an optical fiber bundle or a fly's-eye lens. If, in this manner, the light beam from the light source is condensed on the end surface of the multi-beam forming optical element and the end surface of the pre-stage multi-beam forming optical element is uniformly illuminated by the use of the secondary light source formed by the multi-beam forming optical element, the new secondary light source formed by the post-stage multi-beam forming optical element will be a light source free of irregularity of luminance and uniform in distribution characteristic.

As described above, the present invention has the effect of eliminating non-uniformity of luminance and further, does not reduce the converging efficiency or decrease the irregularity of illuminance in dependence on the location. Thus the invention can provide an ideal light source uniform in angular characteristic can easily be arranged to set the secondary light source to a desired size and shape. Also, the irregularity of luminance or the angular characteristic of the secondary light source caused by the sway of the arc of the super-high-pressure mercury-vapor lamp which is the original light source, the opening-closing of the shutter and the positional deviation of the arc can be made small. This feature provides a constant secondary light source and the elimination of irregularity of illuminance.

What I claim is:

1. An illuminating apparatus for irradiating a surface, said apparatus comprising:
   illuminating means for forming a plurality of secondary light sources;
   multi-beam forming optical means for forming multiple light beams from the radiant energy from said secondary light sources;
   collimating optical means for substantially collimating the radiant energy from said secondary light sources and directing the radiant energy to said multi-beam forming optical means to be formed as multiple light beams thereby; and
   converging optical means for converging the radiant energy as the multiple light beams from said multi-beam forming optical means on the surface to be irradiated.

2. An illuminating apparatus according to claim 1, wherein said illuminating means comprises a light source, a multi-beam forming optical element for forming multiple light beams as said plurality of light sources, and a converging optical element for converging the radiant energy from said light source on said multi-beam forming optical element.

3. An illuminating apparatus according to claim 2, wherein said multi-beam forming optical element is a set of lens arrays disposed at the focus positions thereof.

4. An illuminating apparatus according to claim 2, wherein said multi-beam forming optical element is an optical fiber bundle comprising fibers at random.

5. An illuminating apparatus according to claim 2, wherein said converging optical element is an elliptical mirror.

6. An illuminating apparatus according to claim 2, wherein said converging optical element is a group of condenser lenses.

7. An illuminating apparatus according to claim 1, wherein said multi-beam forming optical means is a set of lens arrays disposed at the focus positions thereof.

8. An illuminating apparatus according to claim 1, wherein said multi-beam forming optical means is an optical fiber bundle.

9. An illuminating apparatus according to claim 1, wherein said multi-beam forming optical means is a set of lens arrays disposed at the focus positions thereof, and wherein in the direction of the optical axis of said apparatus, the forward one of said lens arrays is disposed substantially on the rearward focal plane of said collimating optical means, and the rearward one of said lens arrays is disposed substantially on the forward focal plane of said converging optical means.

10. An illuminating apparatus for irradiating a surface, said apparatus comprising:
a light source for producing light;
first multi-beam forming optical means for forming multiple light beams;
first converging optical means for converging the light produced by said light source on said first multi-beam forming optical means to be formed into multiple light beams thereby;
second multi-beam forming optical means for forming multiple light beams;
lens means for converging the multiple light beams from said first multi-beam forming optical means on said second multi-beam forming optical means to be formed into multiple light beams thereby; and
second converging optical means for converging the multiple light beams from said second multi-beam forming optical means on the surface to be irradiated.

11. An illuminating apparatus according to claim 10, wherein said surface to be irradiated is provided with a mask.

12. An illuminating apparatus according to claim 10, wherein said first multi-beam forming optical means is a set of lens arrays disposed at the focus positions thereof.

13. An illuminating apparatus according to claim 10, wherein said second multi-beam forming optical means is a set of lens arrays disposed at the focus positions thereof.

14. An illuminating apparatus according to claim 10, wherein said first multi-beam forming optical means is an optical fiber bundle having fibers arranged at random.

15. An illuminating apparatus according to claim 10, wherein said first converging optical means is an elliptical mirror, said light source is disposed at the first focal point of said elliptical mirror and said first multi-beam forming optical means is disposed at the second focal point of said elliptical mirror.

* * * * *

UNITED STATES PATENT AND TRADEMARK OFFICE
CERTIFICATE OF CORRECTION

PATENT NO. : 4,497,013
DATED : January 29, 1985
INVENTOR(S) : MASAKATU OHTA

It is certified that error appears in the above-identified patent and that said Letters Patent is hereby corrected as shown below:

Col. 1, line 16, after "and" insert --the--.

Col. 2, line 35, change "reat" to --great--.

Col. 4, line 21, change "lens" to --lenses--;

line 53, change "element" to --element 5--.

Col. 5, line 36, delete "the";

line 51, change "5" to --5'--.

Col. 6, line 32, after "characteristic" insert --and--.

Signed and Sealed this

Eighteenth Day of February 1986

[SEAL]

Attest:

DONALD J. QUIGG

Attesting Officer

Commissioner of Patents and Trademarks